United States Patent [19]
Bernstein

[11] Patent Number: 4,460,891
[45] Date of Patent: Jul. 17, 1984

[54] ANALOG-TO-DIGITAL CONVERTER WITH EXPLICIT INTERPOLATION

[75] Inventor: Norman B. Bernstein, Sharon, Mass.

[73] Assignee: Analog Devices, Incorporated, Norwood, Mass.

[21] Appl. No.: 384,543

[22] Filed: Jun. 3, 1982

[51] Int. Cl.$^3$ .............................................. H03K 13/02
[52] U.S. Cl. ........................ 340/347 AD; 340/347 CC
[58] Field of Search ................. 340/347 AD, 347 NT, 340/347 CC; 324/99 D

[56] References Cited

U.S. PATENT DOCUMENTS

| | | | |
|---|---|---|---|
| 3,541,315 | 11/1970 | Naydan | 340/347 AD |
| 3,646,586 | 2/1972 | Kurz | 340/347 AD |
| 3,938,188 | 2/1976 | Lucas | 340/347 AD |

*Primary Examiner*—C. D. Miller
*Attorney, Agent, or Firm*—Parmelee, Bollinger & Bramblett

[57] ABSTRACT

An analog-to-digital converter operable in sequential phases and including a main digital-to-analog converter (DAC) controlled by a successive-approximation-register to develop a first digital signal representing a first approximation of the analog input signal. In subsequent phases, the residual difference between the anolog input signal and the output of the main DAC is converted to a second digital signal representing the proportion which the residual signal bears to the difference between the first analog output of the main DAC and a second analog output of that DAC after it has been incremented by one least-significant-bit beyond the first DAC input developed in the successive-approximation phase. This proportioning operation is in one embodiment performed by a multiplying A-to-D converter, and in other embodiments is performed by an interpolation DAC. Microcomputer control of the various operations is disclosed.

22 Claims, 6 Drawing Figures

ANALOG-TO-DIGITAL CONVERTER WITH EXPLICIT INTERPOLATION

BACKGROUND OF THE INVENTION

1. Field of the Invention

This invention relates to analog-to-digital converters. More particularly, this invention relates to such converters which are capable of high resolution, e.g. 16 bits or higher.

2. Description of the Prior Art

Analog-to-digital converters of various kinds have been used for many years. So-called successive-approximation converters have been employed in many applications, as have integrating-type converters such as shown in U.S. Pat. No. Re. 29,992. Because of substantial growth in the use of digital data processing equipment, especially high speed computers, there has been a corresponding increase in demand for analog-to-digital converters to interface with such equipment. The higher speed capabilities and other important characteristics of successive-approximation converters have made that type of device generally more suitable for data processing applications.

With the continuing advances in computer technology, there has developed in recent times a need for A-to-D converters having substantially improved performance. Particularly, there is a growing need for converters capable of higher resolution than those presently available for general market application, typically having a resolution of 12 bits or so. Moreover, it is important that such converters be very fast, so that converters of the successive-approximation type or other kinds of programmed converters would be an appropriate starting point. Converters for general market application must also of course be economical to manufacture; thus, the design of a high performance converter for such applications cannot be based on the use of high-accuracy or other expensive components.

One of the most serious problems in achieving high resolution with a successive-approximation A-to-D converter is caused by the differential non-linearity of the D-to-A converter (DAC) which forms part of the A-to-D converter. Such non-linearity is exhibited as output analog "steps" of unequal size for equal-sized digital signal steps at the input to the DAC. Because of such non-linearity (the extreme of which appears as non-monotonicity in the DAC output), the A-to-D converter cannot be made to give more resolution simply by increasing the number of bits handled by the DAC, since that would result in an increasing probability of having missing codes in the output of the A-to-D converter as it is swept through its full range of analog input signals.

SUMMARY OF THE INVENTION

In one embodiment of the invention, to be described hereinbelow in detail, there is provided an analog-to-digital converter which carries out a conversion in a series of sequential phases. In the first phase, a successive-approximation A-to-D converter develops a digital signal comprising a set of higher-order bits of the final digital output signal (and identified herein as the most-significant "M" bits of the final output). This successive-approximation converter is of conventional arrangement, incorporating a digital-to-analog converter (DAC) which is controlled by a successive-approximation-register (SAR) to develop an analog output signal approximating the analog input signal. The analog input signal and the DAC output signal are summed together, and the difference between these signals (referred to as the residue signal) is, in a subsequent phase, converted to a lower-order digital signal, of N bits, which is combined with the M-bit signal to produce the final M+N bit digital output.

In accordance with an important aspect of the invention, a unique procedure is used for converting the residue signal to the lower-order set of digital signal bits. More particularly, and still referring to the embodiment described above, during the residue conversion phase of the operation, the original M-bit DAC output signal is retained at the summing point with the analog input signal, and a second DAC is employed with the successive-approximation register to develop a second digital signal corresponding to the residue. Then, the first DAC is incremented (i.e. its digital input is increased by one) so that its analog output goes up one step, and the second DAC is operated in a successive-approximation mode to produce a third digital signal, this time representing the difference between the analog input signal and the incremented DAC output.

This third digital signal then is added to the second digital signal developed by the second DAC, and the resulting sum is divided into the second digital signal to produce the final N-bit digital output signal to be combined with the original M-bit signal. The final N-bit signal represents the proportion which the residue signal bears to the difference between the first analog output signal of the main DAC and the second (incremented) analog output of that DAC. In effect, this proportioning calculation provides an explicit interpolation between the original main DAC output signal and the incremented main DAC output in accordance with the magnitude of the residue. Thus it will be seen that adverse effects of the differential non-linearity of the main DAC are minimized, and the A-to-D converter output will be smooth and continuous with no missing codes. Advantageously, this invention makes it possible to achieve a resolution which is considerably greater than the accuracy of the main DAC. Other objects, aspects and advantages of the invention will in part be pointed out in, and in part apparent from the following description of preferred embodiments of the invention, considered together with the accompanying drawings.

DETAILED DESCRIPTION OF PREFERRED EMBODIMENTS

Figure 1:
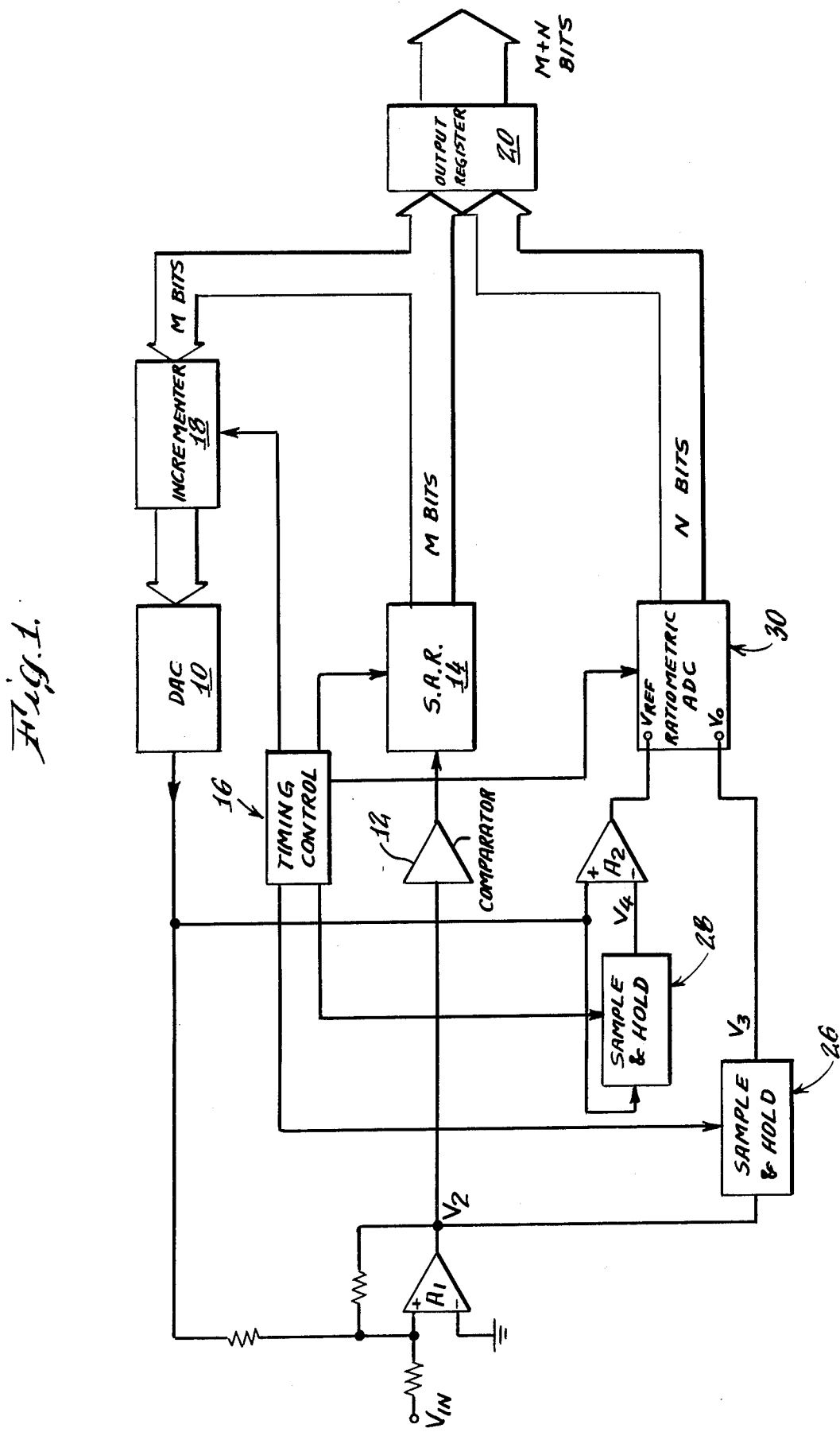
FIG. 1 is a block diagram illustrating an analog embodiment of the invention employing a multiplying a-to-d converter to develop a set of interpolation bits of the final digital output signal.

Referring now to FIG. 1, an analog-to-digital converter in accordance with this invention comprises an input amplifier $A_1$ having an input terminal connected through a summing resistor R to the analog input signal $V_{in}$. A feedback resistor 10R is connected from output to input of the amplifier. The amplifier input terminal also is connected through a second summing resistor R to the output of a digital-to-analog converter (DAC) 10, e.g. a commercially available 10-bit DAC having the capability of producing a monotonic output signal.

The output of the amplifier $A_1$ is directed to a comparator 12 which produces a logic output signal indicating whether the analog input signal $V_{in}$ is larger or smaller than the analog output signal from the DAC 10. This logic signal is supplied to a conventional successive-approximation-register (SAR) 14 which controls the digital input to the DAC 10 in accordance with well known principles.

The operation of the various elements of the analog-to-digital converter is controlled by timed signals from a Timing Control generally indicated at 16. In phase 1 of the conversion, the SAR 14 is activated to respond to the logic signals from the comparator 12, and serves to sequence the DAC digital input in the usual fashion to produce an M-bit digital input signal which develops an analog output signal closely approximating the analog input signal $V_{in}$. (Note: The SAR signals pass through an incrementer 18 without alteration during this phase of the conversion cycle.) The M-bit signal at the DAC input also is coupled to one section of the output register 20 of the converter.

The final DAC output signal will be somewhat smaller in magnitude than the analog input signal $V_1$, but the difference will not be greater than the signal differential corresponding to one least-significant-bit (LSB) of the DAC input signal. The amplifier $A_1$ will produce an output voltage $V_2$ which corresponds to this difference, and which is referred to herein as the residue signal.

The output voltage $V_2$ of amplifier $A_1$ is connected to a sample-and-hold (S/H) circuit 26 the output of which is identified as $V_3$. The output of the DAC 10 is connected to a second sample-and-hold (S/H) circuit 28 the output of which is identified as $V_4$. During phase 1 of the conversion, the S/H circuits are in their sample mode. At the conclusion of phase 1, the S/H circuits 26, 28 are switched to their hold mode, thereby preserving the residue signal and the DAC output signal.

At the start of phase 2, a signal from the Timing Control 16 activates the incrementer 18 to increase by one the M-bit digital input signal at the input of DAC 10. This correspondingly increases the analog output signal of the DAC by one step. This second DAC analog output signal will have a magnitude somewhat larger than the analog input signal $V_{in}$.

This second analog output signal from the DAC 10 is directed to the upper input terminal of an instrumentation amplifier $A_2$, the lower terminal of which receives the first DAC analog output signal $V_4$ from the S/H circuit 28. Thus the output of amplifier $A_2$ is an (appropriately amplified) version of the difference between the second DAC output signal and the original DAC output signal corresponding to the originally-determined M-bit digital output signal at the output register 20. This difference signal is connected to the $V_{ref}$ input terminal of a conventional ratiometric-ADC (analog-to-digital converter) 30, e.g. such as the commercially available 8-bit model referred to as the AD 7574. The lower input terminal $V_o$ of this converter receives the residue signal $V_3$ developed as previously described.

The Timing Control 16 then initiates phase 3 of the conversion by activating the ratiometric-ADC 30. This converter thereupon produces an N-bit digital output signal having a value proportional to the ratio of the residue signal $V_3$ to the difference signal developed at input terminal $V_{ref}$. This N-bit signal is supplied to the output register 20 where it is combined with the previously-developed M-bit signal to create the final M+N bit output signal.

It should be noted that the gain in the signal path from the output of the DAC 10 and through the amplifier $A_1$ and the S/H circuit 26 to the ADC input terminal $V_o$ must be set in correspondence to the gain in the signal path through amplifier $A_2$ to the $V_{ref}$ terminal, in order to assure that the N-bit digital signal is properly scaled. The gains chosen will depend upon practical factors involved in the circuit design.

Figure 2:
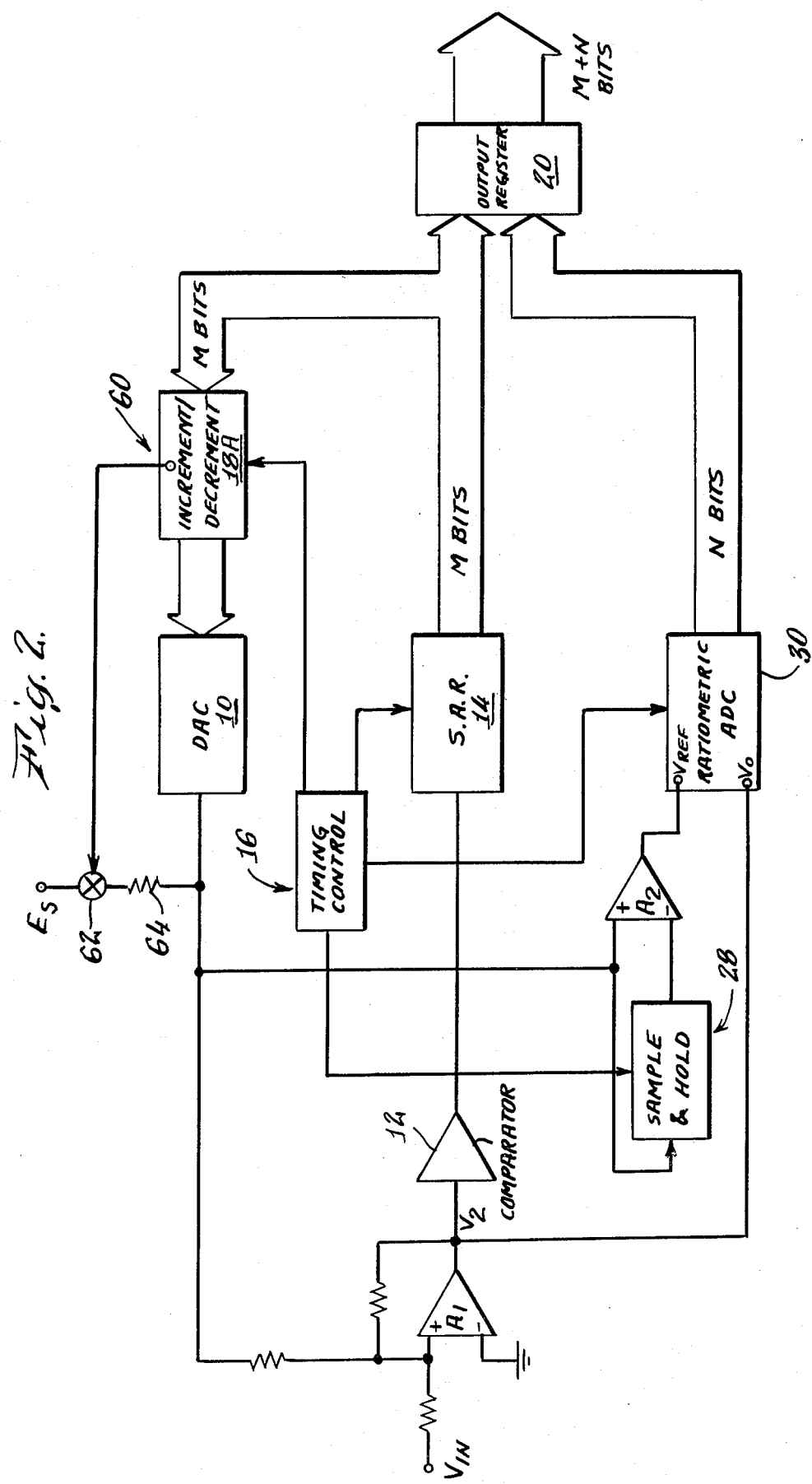
FIG. 2 is a block diagram of another embodiment closely similar to that of FIG. 1, but eliminating the need for one sample-and-hold circuit.

The embodiment shown in FIG. 2 is similar to that of FIG. 1, but carries out a somewhat different conversion procedure arranged to make it possible to eliminate the residue sample-and-hold circuit 26 of FIG. 1. This procedure is generally the same up through the stage where the M-bit digital input signal to the DAC 10 is incremented, except that in FIG. 2 the value of the pre-incremented analog output signal developed from the DAC is not stored in the sample-and-hold circuit 28. Rather, that S/H circuit receives while still in its sample mode the second analog output signal developed from the DAC, i.e. the signal produced after incrementing the DAC input signal by one bit, and the S/H circuit then is shifted to its hold mode to store that second signal for subsequent use.

In phase 3 of the conversion, the digital input signal to the DAC 10 first is decremented by one bit, as by means of a conventional incrementer/decrementer 18A operated by a signal from the Timing Control 16. This serves to bring the digital input for the DAC back to the original M-bit digital signal derived in the initial successive-approximation phase.

After the input to the DAC 10 is decremented, the output of the amplifier $A_1$ will revert to the original residue signal $V_2$. This output therefore is shown connected directly to the $V_o$ input terminal of the ratiometric-ADC 30 without the interposition of a sample-and-hold circuit. (However, this signal path must be arranged with suitable gain to assure proper scaling at the input to the ADC 30, just as in the FIG. 1 embodiment.)

Also in phase 3, the original DAC analog output signal (corresponding to the already-derived M-bit digital output signal) is connected to the upper terminal of the instrumentation amplifier $A_2$ where it is combined with the second (incremented) DAC analog output signal which was stored in the S/H circuit 28. Amplifier $A_2$ will thereupon produce a corresponding difference signal at its output, which is connected to the $V_{ref}$ input terminal of the ratiometric ADC.

Thus, it will be seen that in phase 3 the ADC 30 will receive on its two input terminals the same signals as in the FIG. 1 embodiment. Accordingly, when the ADC subsequently is triggered by the Timing Control 16, at the end of the conversion, it will produce the same N-bit output signal to be combined with the original M-bit digital signal in the output register 20.

Figure 3:
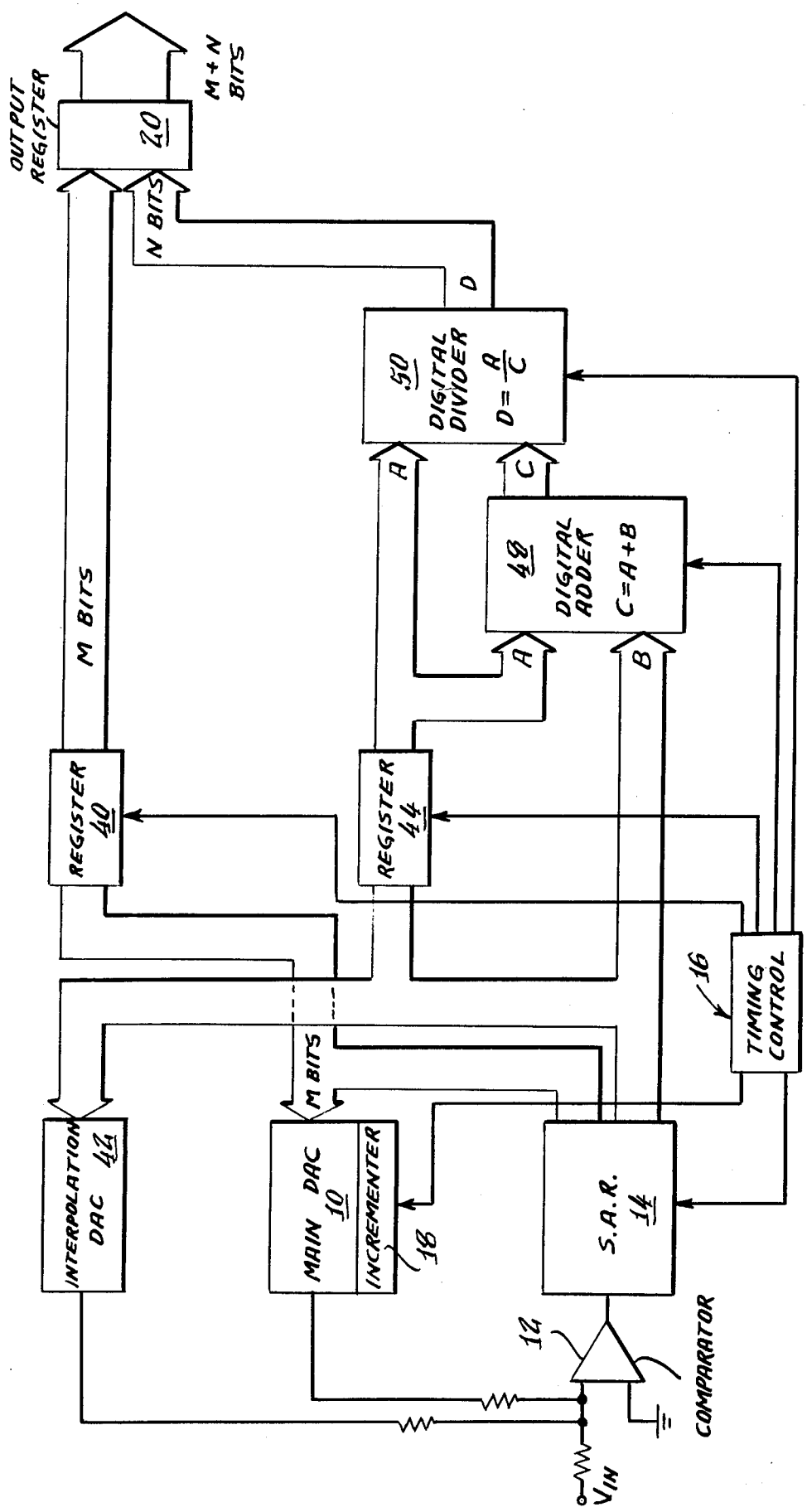
FIG. 3 is a block diagram of a digital embodiment of the invention including a main DAC and an interpolation DAC, both operated by successive-approximation-register means.

Referring now to FIG. 3, there is shown another embodiment of the invention which is similar in many respects to those previously described, but differs in that certain of the operations previously handled by analog techniques are handled here by digital techniques. As before, a Timing Control 16 is employed to send control signals to the various system components to coordinate their functions. In phase 1 of the conversion, a comparator 12 compares the analog input signal $V_{in}$ with the output of the main DAC 10, and correspondingly activates the successive-approximation-register (SAR) 14. This SAR in turn controls the input to the DAC to develop an M-bit digital signal producing a DAC output signal approximating the input signal $V_{in}$. This M-bit digital signal is stored in a first register 40.

In phase 2, the SAR 14 is activated by the Timing Control 16 so as to control a second DAC 42 (referred to as the "interpolation" DAC). The digital input to this DAC is sequenced by the SAR in the usual fashion to produce an output analog signal which approximates the residue signal left by the main DAC 10. For this purpose, the two DAC output signals are summed together with the analog input signal, and the net signal is used as the input for the comparator 12. The resulting digital signal at the input to DAC 42 represents an approximation of the residue signal. This digital signal is stored in a register 44 and identified as "A".

Figure 5:
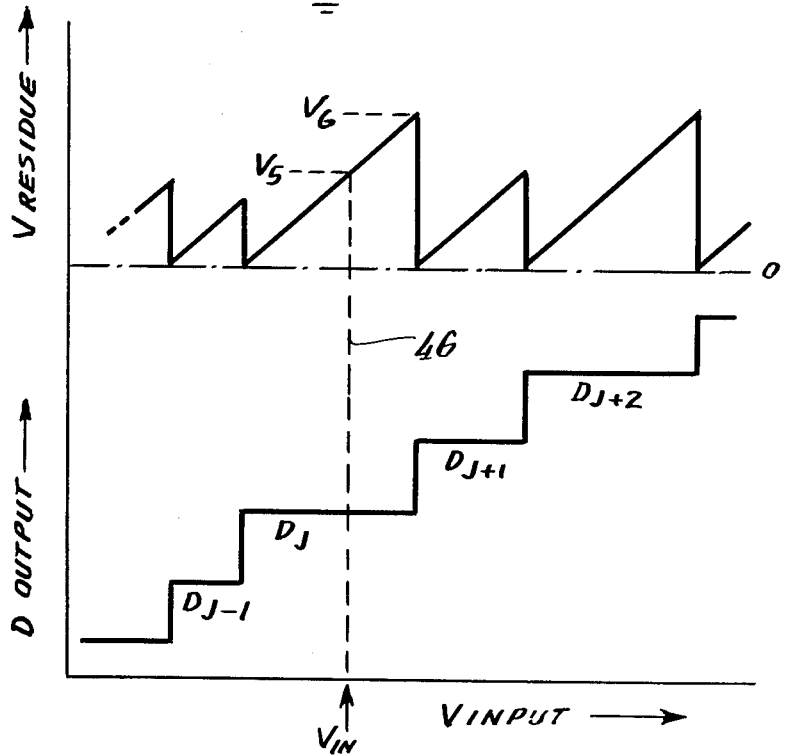
FIG. 5 is a graph demonstrating how the interpolation arrangement functions.

FIG. 5 presents a graph illustrating this phase 2 operation in somewhat symbolic fashion. The output of the main DAC 10 is shown as a step-wise function with the steps individually labelled in subscript order. The analog output which is developed in the main DAC to approximate the analog input signal $V_{in}$ is identified as $D_J$, and is somewhat smaller than the analog input signal. The residue signal is indicated by the intersection of a dotted vertical line 46 from $V_{in}$ and the upper graph, the intersection being referred to as $V_5$. The sawtooth configuration of this graph reflects the interpolating action to be performed by the second DAC 42. The voltage $V_6$ at the upper end of the sawtooth represents the magnitude of the next full step of the main DAC, i.e. the amount by which the next higher analog output signal from that DAC exceeds the original analog output corresponding to the M-bit digital output signal.

Returning now to the description, after phase 2 is complete the Timing Control 16 resets the interpolation DAC 42 to zero, and activates the incrementer 18 to increase the analog output of the main DAC by an amount corresponding to one least-significant-bit of its input. Now the residue at the input to the comparator 12 will be (referring to FIG. 5) the difference between $V_6$ and $V_5$. During phase 3, the interpolation DAC 42 again is activated by the Timing Control 16 and the SAR 14 to execute a successive-approximation sequence, so as to develop a third digital signal corresponding to the difference between $V_6$ and $V_5$. This third digital signal is identified as "B".

This digital signal B is added to the second digital signal A by means of a digital adder 48. The resulting digital sum C is supplied to a digital divider 50 together with the other signal A, and the division $A \div C$ is performed to produce the result D. This signal is developed as an N-bit signal, and represents the proportion which the original residue signal $V_5$ bears to the difference between the first analog output signal developed by the main DAC and the second (incremented) analog output signal developed by that DAC. This N-bit signal is directed to the output register 20 where it is combined with the originally determined M-bit signal to produce the final M+N output signal.

Figure 4:
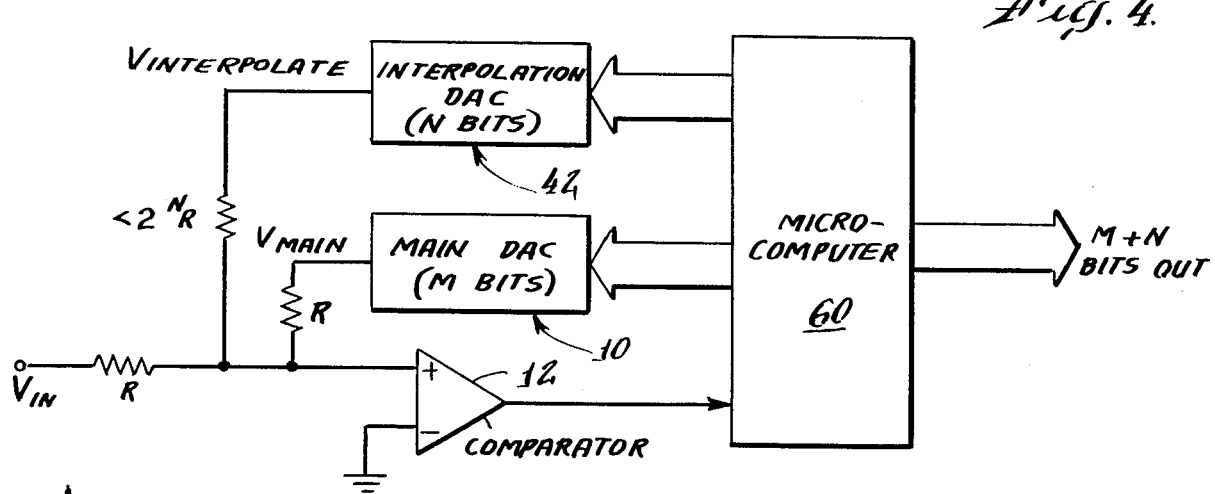
FIG. 4 is a block diagram showing an embodiment of the invention incorporating a microcomputer for controlling a main DAC and an interpolation DAC.

FIG. 4 shows another embodiment of the invention which is functionally equivalent to that of FIG. 3, but wherein the sequence of operations, mathematical functions, signal storage steps, etc., are performed by or under control of a microcomputer 60. It will be apparent to those skilled in the art how the microcomputer can be programmed to carry out the previously-described steps, so no details of such program instructions are disclosed herein.

Figure 6:
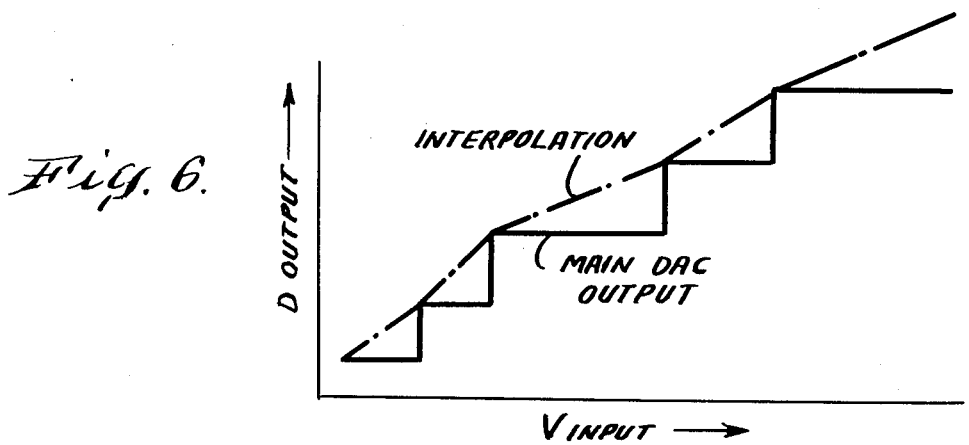
FIG. 6 is a graph illustrating how the final output signal varies in the presence of differential non-linearities in the principal digital-to-analog converter.

FIG. 6 illustrates the overall operation of the converter embodiments described hereinabove. This graph shows in bold outline the step-wise output function of the main DAC 10. It will be understood that the steps typically will not be of the same size, this being the characteristic referred to as differential non-linearity. The dotted-line interconnections between the corners of the steps show how the interpolating operation of the present invention functions. The final output of the analog-to-digital converter represented by the dotted line is smooth and continuous with no missing codes.

It may be noted that the interpolation arrangements described above are designed to carry the digital output only up to the maximum M-bit output of the main DAC 10. For applications where the full M+N bit range must be provided, modified arrangements can readily be provided, based on the concepts of the present invention. For example, with reference to the FIGS. 1-3 configurations, the incrementer 18 can be arranged (1) to produce on an additional output terminal 60 (see FIG. 2) an overflow bit signifying that an incrementing pulse has been received from the Timing Control 16 while the M-bit input signal consists of all "ones", and (2) to continue to transmit the all-ones M-bit signal to the DAC input. The overflow bit could be arranged to close a switch 62 to inject into the DAC output an additional current increment corresponding to one least-significant-bit, e.g. developed by any stable supply $E_s$ connectible through a resistor 64 to the DAC output. This effectively increments the DAC output by one LSB, so that the N-bit interpolation procedure can be carried out as before.

A functionally corresponding modification can be made to the FIG. 4 configuration, through software control. For example, the software can be arranged to monitor the M-bit input to the main DAC for an all "ones" condition. If it occurs, then the third phase can automatically be replaced by a procedure wherein a nominal digital value (proportional to a nominal LSB amplitude) is substituted. In effect, the raw data developed in phase 2 is used directly, without interpolating over any specific step height.

Although several preferred embodiments of the invention have been described herein in detail, it is desired to emphasize that this is for the purpose of illustrating the principles of the invention, and should not necessarily be construed as limiting of the invention since it is apparent that those skilled in this art can make many modified arrangements of the invention without departing from the true scope thereof.

I claim:

1. A high-resolution analog-to-digital converter adapted to receive an analog input signal and to produce a corresponding digital output signal, said converter comprising:

a DAC for converting an M-bit input signal to a corresponding analog output signal;

comparator means responsive to the difference between said analog input signal and said analog output signal from said DAC;

control means responsive to the comparator means output for sequencing the digital input of said DAC in one phase of the conversion to develop an M-bit digital signal serving to identify the most-significant M bits of the final digital output signal;

means for developing a residual signal reflecting the difference between said analog input signal and the analog output signal of said DAC representing said M-bit digital signal;

means operable in another phase of the conversion to increment the digital input to said DAC to produce a second analog output signal corresponding to the next higher M-bit input signal;

means to temporarily store at least one of said two DAC analog output signals;

means responsive to said residual signal and to the difference between said stored DAC output signal and the other of said DAC output signals for developing an N-bit digital signal representing the proportion which said residual signal bears to said difference; and means to combine said M-bit and N-bit signals to produce a final M+N bit digital output signal.

2. Apparatus as claimed in claim 1, including means to develop a difference signal reflecting the difference between said two analog signals;

said means for developing said N-bit signal comprising means to divide said residual signal by said difference signal.

3. Apparatus as claimed in claim 1, including a successive-approximation-register responsive to the output of said comparator means for developing said first M-bit signal at the input of said DAC.

4. Apparatus as claimed in claim 1, including sample-and-hold means coupled to the output of said DAC to store said first analog output signal for comparison with the second analog output signal from said DAC after being incremented.

5. Apparatus as claimed in claim 4, including an amplifier having one input connected to said sample-and-hold means and the other input coupled to the output of said DAC to receive therefrom said incremented analog output signal, whereby to produce from said amplifier a difference signal representing the difference in magnitude between said two analog output signals from said DAC.

6. Apparatus as claimed in claim 5, including a multiplying a-to-d converter receiving on one of its two analog input terminals the output from said amplifier; and means to supply to the other of said analog input terminals a signal representing said residual signal, said a-to-d converter producing said N-bit signal to be combined with said first M-bit signal.

7. Apparatus as claimed in claim 6, wherein said supply means comprises a second sample-and-hold means arranged to receive an input signal reflecting the difference between said analog input signal and said DAC output signal prior to incrementing thereof.

8. Apparatus as claimed in claim 1, including means to develop an analog signal representing the difference between said two analog output signals from said DAC;

a multiplying a-to-d converter receiving said difference signal at one of its two input terminals; and means to supply said residue signal to the other of its two input terminals, said a-to-d converter producing said N-bit signal to be combined with said M-bit signal.

9. Apparatus as claimed in claim 1, wherein the means for producing said N-bit signal comprises an interpolation DAC for developing a digital residue signal representing the difference between said analog input signal and the analog output signal from said first DAC prior to the incrementing thereof.

10. Apparatus as claimed in claim 1, including register means for storing said digital residue signal;

means for operating said interpolation DAC to produce a digital signal representing the difference between said analog input signal and the analog output signal from said first DAC after incrementing;

means for adding said digital difference signal to said digital residue signal and for dividing the result into said digital residue signal to produce said N-bit digital signal.

11. Apparatus as claimed in claim 9, wherein the output of said interpolation DAC is summed with the output of said first DAC and said analog input signal.

12. An analog-to-digital converter comprising:

first means responsive to the analog input signal in a first phase of the conversion to produce a first digital signal identifying the first M bits of the final digital output signal and to develop a first analog output signal corresponding to those M bits;

second means responsive to said analog input signal and said first analog output signal and operable in a second phase of the conversion to produce a digital residue signal representing the difference between said analog input signal and said first analog output signal;

third means activated after said second phase of the conversion and serving to operate said first means to develop therefrom a second analog output signal representing the M-bit digital signal which is one bit higher than said first digital signal;

fourth means for producing an N-bit digital signal representing the proportion which said digital residue signal bears to the difference between said first and second analog output signals; and means for combining said first M-bit digital signal with said N-bit digital signal to form the final digital output signal.

13. Apparatus as claimed in claim 12, including means for developing a digital difference signal representing said difference between said two analog output signals; and said means for producing said N bit signal comprising means to divide said digital residue signal by said digital difference signal.

14. Apparatus as claimed in claim 12, wherein said first means comprises a main DAC operated by successive-approximation-register means controlled by a comparator.

15. Apparatus as claimed in claim 14, wherein said second means comprises an interpolation DAC operable by said successive-approximation-register means.

16. Apparatus as claimed in claim 12, including microcomputer means providing for operation of said first, second, third and fourth means.

17. Apparatus as claimed in claim 16, including a main DAC and an interpolation DAC controlled by said microcomputer.

18. The method of converting an analog input signal to a corresponding digital output signal comprising the steps of:
applying said analog input signal to an a-to-d converter including a controlled DAC to produce at the DAC input an M-bit digital signal representing a set of higher-order bits of the final digital output signal and to produce a corresponding first analog output signal at the DAC output;
developing a residue signal representing the difference between said analog input signal and said first analog signal;
incrementing said DAC to produce a second analog output signal corresponding to the next higher output step of the DAC;
developing an N-bit signal representing the proportion which said residue signal bears to the difference between said first and second DAC analog output signals; and
combining said M-bit and N-bit signals to produce the final M+N bit digital output signal.

19. The method of claim 18, wherein said residue signal is developed as a digital signal;
developing a digital difference signal representing the difference between said first and second analog output signals;
operating on said digital residue signal and said digital difference signal to produce said N-bit signal.

20. The method of claim 19, wherein said digital residue signal is divided by said digital difference signal to produce said N-bit signal.

21. The method of claim 19, wherein said digital difference signal is developed by:
producing an intermediate digital signal representing the difference between said analog input signal and said second analog output signal; and
adding said digital residue signal to said intermediate digital signal to produce said digital difference signal.

22. The method of claim 21, wherein said digital residue signal and said intermediate digital signal are developed by an interpolation DAC operable with successive-approximation-register means.

* * * * *